(12) United States Patent
Nakayama

(10) Patent No.: US 9,504,166 B2
(45) Date of Patent: Nov. 22, 2016

(54) PROCESS FOR PRODUCING SUBSTRATE FOR MOUNTING ELEMENT

(71) Applicant: Asahi Glass Company, Limited, Chiyoda-ku (JP)

(72) Inventor: Katsuyoshi Nakayama, Tokyo (JP)

(73) Assignee: ASAHI GLASS COMPANY, LIMITED, Chiyoda-ku (JP)

(*) Notice: Subject to any disclaimer, the term of this patent is extended or adjusted under 35 U.S.C. 154(b) by 224 days.

(21) Appl. No.: 14/219,583

(22) Filed: Mar. 19, 2014

(65) Prior Publication Data

US 2014/0201993 A1 Jul. 24, 2014

Related U.S. Application Data

(62) Division of application No. 12/955,488, filed on Nov. 29, 2010, now abandoned.

(30) Foreign Application Priority Data

Jan. 29, 2010 (JP) .................................. 2010-018925
Sep. 10, 2010 (JP) .................................. 2010-203104

(51) Int. Cl.
*H05K 3/10* (2006.01)
*H05K 3/30* (2006.01)
(Continued)

(52) U.S. Cl.
CPC ................. *H05K 3/30* (2013.01); *B24C 3/322* (2013.01); *B24C 7/0007* (2013.01); *H01L 23/13* (2013.01); *H01L 23/15* (2013.01); *H01L 23/49827* (2013.01); *H05K 3/246* (2013.01); *H01L 33/62* (2013.01); *H01L 2924/0002* (2013.01);

(Continued)

(58) Field of Classification Search
CPC .................. H01L 2924/0002; H01L 2924/00; H01L 23/13; H01L 23/15; H01L 23/49827; H01L 2924/09701
See application file for complete search history.

(56) References Cited

U.S. PATENT DOCUMENTS 5,067,007 A 11/1991 Otsuka et al.
5,219,639 A * 6/1993 Sugawara ............. H01L 21/486
174/261

(Continued)

FOREIGN PATENT DOCUMENTS

JP 2003-253454 9/2003
JP 2004-63811 A 2/2004

(Continued)

OTHER PUBLICATIONS

Extended European Search Report issued Mar. 16, 2011, in European Patent Application No. 10015150.5-2203.

(Continued)

*Primary Examiner* — Minh Trinh
(74) *Attorney, Agent, or Firm* — Oblon, McClelland, Maier & Neustadt, L.L.P.

(57) ABSTRACT

A process for producing a substrate for mounting element includes forming a thick conductor layer-provided substrate having a thick conductor layer made of a metal composed mainly of silver (Ag) or copper (Cu), on a surface of an inorganic insulating substrate made of an inorganic insulating material, applying wet blast treatment to the thick conductor layer to planarize the surface of the thick conductor layer to a surface roughness Ra of at most 0.02 μm, and forming a nickel (Ni)/gold (Au)-plated layer on the thick conductor layer having the surface planarized by the wet blast treatment.

20 Claims, 2 Drawing Sheets

(51) Int. Cl.
*B24C 3/32* (2006.01)
*B24C 7/00* (2006.01)
*H01L 23/13* (2006.01)
*H01L 23/15* (2006.01)
*H01L 23/498* (2006.01)
*H05K 3/24* (2006.01)
*H01L 33/62* (2010.01)
*H05K 1/03* (2006.01)
*H05K 1/11* (2006.01)

(52) U.S. Cl.
CPC ... *H01L2924/09701* (2013.01); *H05K 1/0306* (2013.01); *H05K 1/113* (2013.01); *H05K 2201/0347* (2013.01); *H05K 2201/09472* (2013.01); *Y10T 29/49155* (2015.01)

(56) References Cited

U.S. PATENT DOCUMENTS

| | | | | |
|---|---|---|---|---|
| 7,241,510 | B2* | 7/2007 | Dunn | B32B 7/06 428/615 |
| 8,338,716 | B2 | 12/2012 | Nakahara et al. | |
| 2002/0117330 | A1 | 8/2002 | Eldridge et al. | |
| 2008/0130196 | A1* | 6/2008 | Kanno | H01G 4/008 361/301.3 |
| 2009/0301764 | A1 | 12/2009 | Kawamura et al. | |
| 2010/0071940 | A1* | 3/2010 | Ejiri | C23C 18/1651 174/257 |
| 2011/0186336 | A1* | 8/2011 | Nakayama | B24C 3/322 174/255 |

FOREIGN PATENT DOCUMENTS

| | | |
|---|---|---|
| JP | 2004-260220 | 9/2004 |
| JP | 2005-294526 | 10/2005 |
| JP | 2006-80203 A | 3/2006 |
| JP | 2006-93493 | 4/2006 |
| JP | 2006-196656 | 7/2006 |
| JP | 2008-34828 | 2/2008 |
| JP | 4089902 | 3/2008 |

OTHER PUBLICATIONS

Office Action issued Aug. 16, 2012, in European Patent Application No. 10 015 150.5.

Office Action issued Oct. 22, 2013 in corresponding Japanese Patent Application No. 2010-203104 with English Translation.

* cited by examiner

PROCESS FOR PRODUCING SUBSTRATE FOR MOUNTING ELEMENT

CROSS-REFERENCE TO RELATED APPLICATIONS

This application is a divisional of and claims the benefit of priority to U.S. Ser. No. 12/955,488, filed Nov. 29, 2010, which is based on and claims the benefit of priority to Japanese Patent Application No. 2010-018925, filed Jan. 29, 2010 and Japanese Patent Application No. 2010-203104, filed Sep. 10, 2010, including specifications, claims, drawings and summaries. The entire contents of these applications are incorporated herein by reference.

TECHNICAL FIELD

The present invention relates to a substrate for mounting element and a process for its production, particularly to a substrate for mounting element excellent in sulfurization resistance, wherein planarity of a surface of a thick conductor layer formed on the substrate surface is good, and a process for producing such a substrate.

BACKGROUND ART

In recent years, along with a tendency to a high brightness and whitening of a light-emitting diode (hereinafter referred to as LED) element, a light-emitting device employing a LED element has been used for backlights of mobile phones or liquid crystal TVs or liquid crystal displays, generic illumination, etc. Accordingly, peripheral components of a LED element are also required to have higher performance. For example, as a substrate to mount a LED element, one made of a resin material is used. However, such a resin substrate is likely to be deteriorated by a heat or light accompanying higher brightness of a LED element. Accordingly, a study has been made to use a substrate made of e.g. an inorganic insulating material.

Such an inorganic insulating material may, for example, be a ceramics such as alumina or aluminum nitride, or a low temperature co-fired ceramics (LTCC) which is a composite of glass with a ceramics powder such as alumina. LTCC is one fired usually at a temperature of from about 800 to 1,000° C., which is lower than the firing temperature for usual ceramics and is prepared by laminating a prescribed number of green sheets made of glass and a ceramics powder (such as an alumina powder or a zirconia powder), integrating them by hot pressing, followed by firing. An inorganic insulating substrate made of such inorganic insulating materials has a higher durability against a heat or light as compared with a resin substrate and thus is prospective as a substrate for mounting a LED element.

On the surface of an inorganic insulating substrate, a thick conductor layer is formed which is prepared by printing a paste composed mainly of a conductor metal such as silver (Ag) or copper (Cu), followed by firing. And, among such thick conductor layers, particularly terminal portions (electrodes) to be connected to the element are subjected to lamination plating (Ni/Au plating) of nickel (Ni) plating and gold (Au) plating to maintain the wire bonding property, the adhesion strength and the weather resistance. By such Ni/Au plating, sulfurization resistance is imparted to prevent a color change by a reaction of the thick conductor layer with a sulfur (S) content in the air, etc.

However, in recent years, a substrate to mount a LED element or the like, is required to have sulfurization resistance, and with conventional plated thicknesses (Ni-plated thickness of from 3 to 5 μm/Au-plated thickness of from 0.1 to 0.3 μm) required for the wiring bonding portions, there has been a problem that a color change to black is observed at the Ni/Au-plated portion in a sulfurization test in accordance with JIS-C-60068-2-43, thus failing to pass the sulfurization test.

By a research conducted by the present inventor, it has been found that such a color change of the Ni/Au-plated portion is attributable to formation of nickel sulfide by a Ni-plated layer exposed to the surface. That is, a thick conductor of Ag or the like has grain boundary void spaces or surface irregularities, and even if a Ni-plated layer is formed, irregularities will remain on its surface, and even if Au-plating is applied as the uppermost layer, if it cannot completely cover the Ni-plated layer, the Ni-plated layer as an underlayer of the Au-plated layer will be exposed on the surface. And, such an exposed Ni-plated layer and a sulfur (S) content will react to form black-colored nickel sulfide.

Heretofore, as a technique to prevent such sulfurization (color change) of connection terminal portions, a method of applying a protective coat by e.g. a silicone resin on the Ni-plated layer, a method of forming a thick Au layer by paste printing instead of plating, or a method of increasing the thickness of the Au-plated layer, has been known. Further, particularly in the case of a LTCC substrate, a method has been known wherein the particle size of the Ag powder to be used as a conductor to constitute the thick conductor layer is made small to improve the sintering property thereby to reduce grain boundaries.

However, the method of forming a thick Au layer or increasing the thickness of the Au-plated layer has had a problem that the production cost increases substantially. Further, in the case of the LTCC substrate, there has been a problem such that if the sintering property is improved by reducing the particle size of the Ag powder, timing in shrinkage by firing will not meet with the substrate whereby the substrate is likely to undergo warpage.

Further, as a technique to treat the surface of the conductor layer formed on a LTCC substrate to improve the plating property, a method has been proposed wherein prior to a plating step, the surface of a LTCC substrate is subjected to wet blast treatment, and glass exposed on the surface of the conductor layer is removed (e.g. Patent Document 1).

However, by this method, it was not possible to increase the sulfurization resistance by removing the grain boundary void spaces or surface irregularities of the thick conductor (Ag) layer. That is, although Patent Document 1 does not disclose the conditions for the wet blast treatment in detail, the blast treatment to remove glass is one to break and remove glass as a hard substance in a short time by blasting. Under blast treatment conditions for such a purpose, it has been difficult to fill spaces among the conductor (Ag) particles. And, it has been difficult to remove the surface irregularities of the thick conductor (Ag) layer thereby to planarize (smooth) the layer surface to such an extent to make it possible to completely cover it with the Au-plated layer having a usual thickness.

PRIOR ART DOCUMENT

Patent Document

Patent Document 1: Japanese Patent No. 4,089,902

DISCLOSURE OF THE INVENTION

Object to be Accomplished by the Invention

The present invention has been made to solve the above-described problems, and it is an object of the present invention to provide a substrate for mounting element having sulfurization resistance improved by increasing the planarity of the surface of a thick conductor layer formed on an inorganic insulating substrate.

Means to Accomplish the Object

The substrate for mounting element of the present invention comprises an inorganic insulating substrate made of an inorganic insulating material, a thick conductor layer formed on the inorganic insulating substrate and made of a metal composed mainly of silver (Ag) or copper (Cu), and an electroconductive metal-plated layer formed on the thick conductor layer, wherein the thick conductor layer has its surface planarized by wet blast treatment and has a surface roughness Ra of at most 0.02 μm.

In the substrate for mounting element of the present invention, the inorganic insulating substrate may be a low temperature co-fired ceramics (LTCC) substrate. Otherwise, the inorganic insulating substrate may be a ceramics substrate. And, the ceramics substrate may contain alumina or aluminum nitride as the main component. Further, the electroconductive metal-plated layer is preferably a nickel (Ni)/gold (Au)-plated layer.

The process for producing a substrate for mounting element of the present invention comprises a step of forming a thick conductor layer-provided substrate having a thick conductor layer made of a metal composed mainly of silver (Ag) or copper (Cu), on a surface of an inorganic insulating substrate made of an inorganic insulating material, a step of applying wet blast treatment to the thick conductor layer to planarize the surface of the thick conductor layer to a surface roughness Ra of at most 0.02 μm, and a step of forming a nickel (Ni)/gold (Au)-plated layer on the thick conductor layer having the surface planarized by the wet blast treatment.

In the process for producing a substrate for mounting element of the present invention, the above step of forming a thick conductor layer-provided substrate may comprise a step of printing a metal paste composed mainly of silver (Ag) or copper (Cu) on a surface of a substrate made of a glass ceramics composition comprising a glass powder and a ceramics powder, to form a conductor pattern, and a step of firing the substrate having the conductor pattern formed to sinter the glass ceramics composition and fire the metal paste thereby to form the thick conductor layer made of a metal composed mainly of silver (Ag) or copper (Cu). Further, the above step of forming a thick conductor layer-provided substrate may comprise a step of firing a ceramics composition comprising a ceramics powder and a sintering aid to obtain a ceramics substrate, a step of printing a metal paste composed mainly of silver (Ag) or copper (Cu) on a surface of the ceramics substrate to form a conductor pattern, and a step of re-firing the ceramics substrate having the conductor pattern formed to form, from the metal paste, the thick conductor layer made of a metal composed mainly of silver (Ag) or copper (Cu).

And, it is preferred that an abrasive to be used for the wet blast treatment is a ceramics powder having a particle size of from 25 to 150 μm, and a medium is water. Further, the mixing ratio of the abrasive is preferably from 20 to 60 vol % based on the total amount of the abrasive and the water. Further, in the above wet blast treatment, it is preferred that a blast liquid comprising the abrasive and the water is jetted from a jet orifice of 8 mm in diameter, of a nozzle made of boron carbide, and the pressure is from 1.2 to 1.8 kg/cm$^2$.

Further, in the present invention, the surface roughness Ra is one represented by JIS B0601 (1994), 3 "Definition and Representation of Defined Arithmetic Mean Roughness". In the present invention, the surface roughness Ra was measured by SURFCOM 1400D (name of machine, manufactured by Tokyo Seimitsu Co., Ltd.).

Advantageous Effects of the Invention

According to the present invention, the thick conductor layer made of a metal such as silver (Ag) or copper (Cu) formed on the surface of the inorganic insulating substrate, is planarized (smoothed) by the wet blast treatment, and spaces among the thick conductor (Ag) particles are filled and the surface roughness Ra is adjusted to be at most 0.02 μm, whereby the plating property is good, and the thick conductor surface can be completely covered even by a Au-plated layer having a usual thickness. Thus, it is possible to obtain a substrate for mounting element, which is excellent in sulfurization resistance.

BEST MODE FOR CARRYING OUT THE INVENTION

Figure 1:
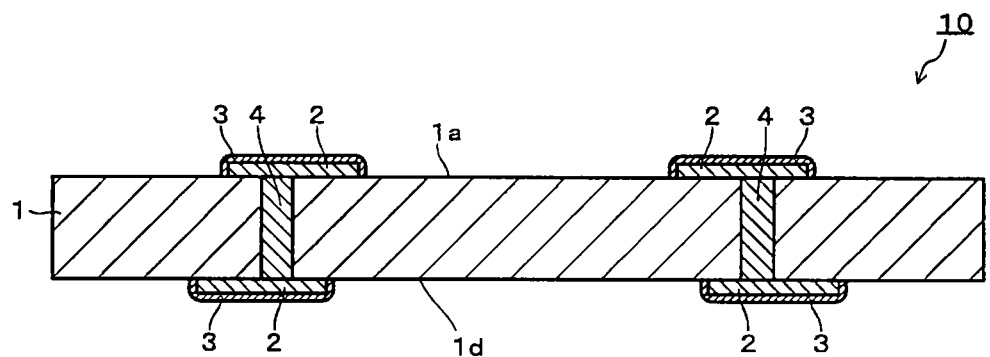
FIG. 1 is a cross-sectional view illustrating an example of the substrate for mounting element of the present invention.
Figure 2:
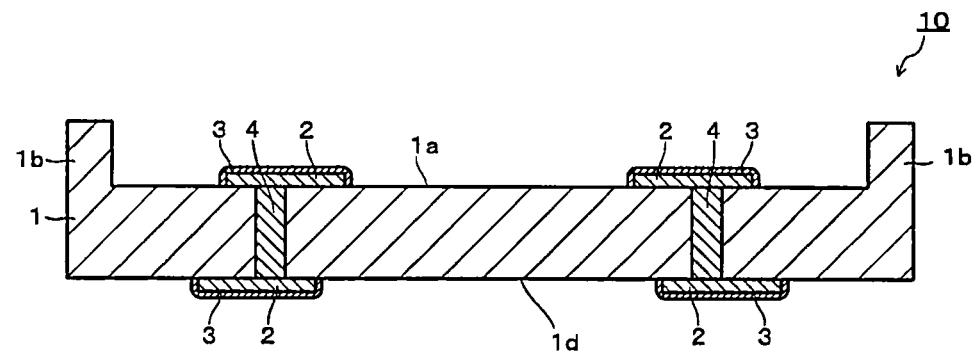
FIG. 2 is a cross-sectional view illustrating another example of the substrate for mounting element of the present invention.

Now, the embodiments of the present invention will be described in detail. FIGS. 1 and 2 are, respectively, cross-sectional views illustrating the substrate 10 for mounting element of the present invention. The substrate 10 for mounting element has an inorganic insulating substrate 1 made of an inorganic insulating material, and one main surface (the upper surface in Figs.) is a mounting surface 1a on which an element (a semiconductor element) such as a LED element is to be mounted. The inorganic insulating substrate 1 may be a low temperature co-fired ceramics substrate (LTCC substrate) made of a sintered product of a glass ceramics composition comprising a glass powder and a ceramics powder, or a ceramics substrate made of a sintered product composed mainly of alumina or aluminum nitride. Further, the shape, thickness, size, etc. of the inorganic insulating substrate 1 are not particularly limited. Further, the inorganic insulating substrate 1 may be one having a flat-form as shown in FIG. 1, or one having such a shape that a side wall 1b is provided along the periphery of the substrate to form a mounting surface 1a in a cavity, as shown in FIG. 2.

The raw material composition of the inorganic insulating material to constitute the inorganic insulating substrate 1, the firing conditions, etc. will be described in the production process given hereinafter.

Figure 3:
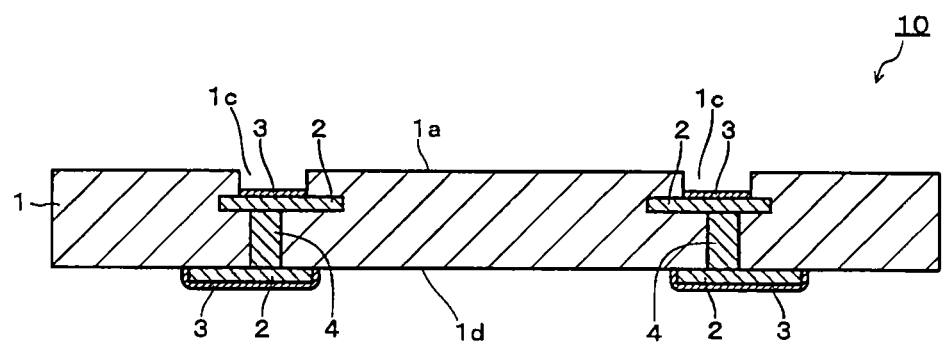
FIG. 3 is a cross-sectional view illustrating a third example of the substrate for mounting element of the present invention.
Figure 4:
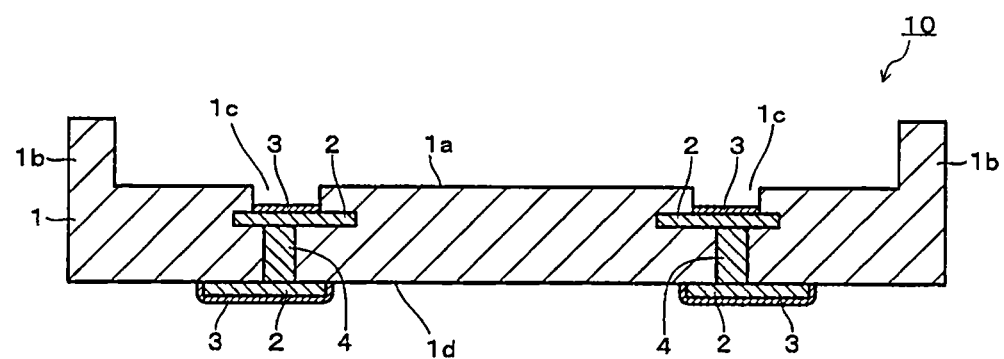
FIG. 4 is a cross-sectional view illustrating a fourth example of the substrate for mounting element of the present invention.

On the mounting surface 1a of the inorganic insulating substrate 1, a thick conductor layer 2 being a connection terminal (electrode) to be electrically connected to an element such as a LED element, is formed. The thick conductor layer 2 is made of a conductor metal composed mainly of silver (Ag) or copper (Cu) and is formed by printing a conductor metal paste by e.g. screen printing, followed by firing, as described hereinafter. The thick conductor layer 2 is formed on the same plane as the mounting surface 1a. Here, in a case where the inorganic insulating substrate 1 is a LTCC substrate, as shown in FIGS. 3 and 4, a concave 1c may be formed on the mounting surface 1a, and the thick conductor layer 2 may be formed on the bottom surface in the concave 1c.

Such a thick conductor 2 has its surface planarized or smoothed (hereinafter referred to as planarization) by wet blast treatment and has a surface roughness Ra of at most 0.02 μm. Further, on such a thick conductor layer 2 having the surface planarized, a Ni/Au-plated layer 3 is formed to have a laminated structure comprising a nickel (Ni)-plated layer and a gold (Au)-plated layer formed thereon, and the surface of the thick conductor layer 2 is thereby completely covered without a space. If the surface roughness Ra of the thick conductor layer 2 exceeds 0.02 μm, it tends to be difficult to completely cover the surface of the thick conductor layer 2 by the Ni/Au-plated layer 3, and the sulfurization resistance tends to be inadequate. The surface roughness Ra of the thick conductor layer 3 is more preferably at most 0.01 μm.

Also on a non-mounting surface 1d being a main surface on the side opposite to the mounting surface 1a of the inorganic insulating substrate 1, a thick conductor layer 2 may be formed as an external connection terminal (electrode). In such a structure, also the surface of the thick conductor layer 2 formed on the non-mounting surface 1d is preferably planarized by wet blast treatment in the same manner as the thick conductor layer 2 formed on the mounting surface 1a. That is, also the thick conductor layer 2 formed on the non-mounting surface 1d is preferably planarized by wet blast treatment to have a surface roughness Ra of at most 0.02 μm, and has such a structure that a Ni/Au-plated layer 3 is formed thereon to completely cover the surface of the thick conductor layer 2 without a space. Here, in FIGS. 1 to 4, symbol 4 represents a via conductor which electrically connects an element connection terminal on the mounting surface 1a and an external connection terminal on the non-mounting surface 1d.

In the substrate 10 for mounting element of the present invention, the thick conductor layer 2 made of a metal such as silver (Ag) or copper (Cu) formed on the surface of the inorganic insulating substrate 1, is planarized by wet blast treatment to a surface roughness Ra of at most 0.02 μm, and the Ni/Au-plated layer 3 is formed thereon to completely cover the surface of the thick conductor layer 2 without a space, whereby no color change will take place in the sulfurization test, and the sulfurization resistance is excellent.

Among the substrates 1 for mounting element of the present invention, the substrate 1 for mounting element having a LTCC substrate can be produced as follows.

Production of Substrate for Mounting Element Having LTCC Substrate

Formation of Glass Ceramics Green Sheet

Firstly, a glass ceramics green sheet is formed. This green sheet is formed by adding a binder and, as the case requires, a plasticizer, a solvent, etc. to a glass ceramics composition comprising a glass powder and a ceramics powder (hereinafter referred to as a ceramics powder for LTCC) to prepare a slurry, and forming the slurry into a sheet by e.g. a doctor blade method, followed by drying.

The glass powder is not necessarily limited, but one having a glass transition point (Tg) of at least 550° C. and at most 700° C., is preferred. If the glass transition point (Tg) is lower than 550° C., the after-mentioned binder burn out is likely to be difficult, and if it exceeds 700° C., the shrinkage-initiating temperature tends to be high, and the dimensional precision is likely to deteriorate.

As the glass powder, for example, a glass powder comprising from 57 to 65 mol % of $SiO_2$, from 13 to 18 mol % of $B_2O_3$, from 9 to 23 mol % of CaO, from 3 to 8 mol % of $Al_2O_3$, and from 0.5 to 6 mol % in total of at least one selected from $K_2O$ and $Na_2O$, is used. The 50% particle size ($D_{50}$) of the glass powder is preferably from 0.5 μm to 2 μm. If $D_{50}$ of the glass powder is less than 0.5 μm, the glass powder is likely to cohere, and not only the handling tends to be difficult, but also it tends to be difficult to uniformly disperse it. On the other hand, if $D_{50}$ exceeds 2 μm, an increase of the glass softening temperature or the sintering failure is likely to occur. Here, in this specification, the particle size is a value obtained by a particle size analyzer of a laser diffraction scattering method. As the particle size analyzer of a laser diffraction scattering method, a laser diffraction particle size analyzer (tradename: SALD2100 manufactured by Shimadzu Corporation) was used.

As the ceramics powder for LTCC, one which has been commonly used for the production of a LTCC substrate, can be used. For example, an alumina powder, a zirconia powder, or a mixture of an alumina powder and a zirconia powder may, for example, be suitably used. $D_{50}$ of the ceramics powder is preferably at least 0.5 μm and at most 4 μm.

Such a glass powder and a ceramics powder are blended and mixed, for example, so that the glass powder would be from 30 mass % to 50 mass %, and the ceramics powder would be from 50 mass % to 70 mass % to obtain a glass ceramics composition. To such a glass ceramics composition, a binder and, if required, a plasticizer, a solvent, etc. are added to obtain a slurry.

As the binder, it is possible to suitably use, for example, a polyvinyl butyral or an acrylic resin. As the plasticizer, it is possible to use, for example, dibutyl phthalate, dioctyl phthalate or butylbenzyl phthalate. Further, as the solvent, it is possible to employ an aromatic or alcohol-type organic solvent such as toluene, xylene or butanol. Further, a dispersing agent or a leveling agent may also be used.

The glass ceramics green sheet thus formed is cut into a prescribed size by using a punch cutting die or a punching machine, and at the same time, via holes for interlayer connection are formed by punching at prescribed positions.

Printing of Metal Paste

On the surface of the glass ceramics green sheet, a conductor metal paste is printed by a method such as screen printing to form a non-fired conductor pattern. Further, a conductor metal paste is filled in the above-mentioned via holes for interlayer connection, to form a non-fired interlayer connection portion. The conductor metal paste may, for example, be one prepared by adding a vehicle such as ethylcellulose and, as the case requires, a solvent, etc. to a metal powder composed mainly of e.g. silver (Ag) or copper (Cu) to form a paste. As the metal powder, a silver (Ag)

powder, a mixed powder of silver and palladium, or a mixed powder of silver and platinum, is, for example, preferably used. Here, the adhesive strength between the conductor metal and the substrate can be sufficiently secured by the glass component contained in the glass ceramics green sheet, and it is preferred to use a metal paste having no glass frit incorporated, in order not to increase the electrical resistance (resistance value) of the conductor metal.

Lamination and Filing of Glass Ceramics Green Sheet

A plurality of green sheets having non-fired conductor patterns formed are overlaid one on another while adjusting their positions and integrated by heating and pressing, followed by heating at a temperature of from 500° C. to 600° C. to carry out binder burn out by decomposing and removing a binder such as a resin contained in the glass ceramics green sheet. Thereafter, heating is carried out further at a temperature of from about 800 to 1,000° C. to fire the glass ceramics composition constituting the glass ceramics green sheet. By this firing, the metal paste formed inside and on the surfaces (the front and rear surfaces) of the glass ceramics substrate is simultaneously fired to form a thick conductor layer made of a metal composed mainly of silver (Au) or copper (Cu).

Wet Blast Treatment

The thick conductor layer formed on the surface of the LTCC substrate is subjected to wet blast treatment. That is, a blast liquid prepared by mixing an abrasive (blast material) with a liquid medium (such as water) is blasted (blown) to the thick conductor layer under high pressure. By this wet blast treatment, spaces among the conductor particles are filled so that the surface of the thick conductor layer is planarized. By adjusting the particle size of the abrasive, the blast force (pressure) of the blast liquid, the treating time, etc., the surface roughness (Ra) of the thick conductor layer after the treatment can be adjusted to be at most 0.02 µm.

As the abrasive, a ceramic powder such as alumina or zirconia may, for example, be used. In order to increase the blasting efficiency, it is preferred to use a pulverized powder of an alumina powder. The particle size of the abrasive is preferably within a range of from 25 to 150 µm. If the particle size of the abrasive is less than 25 µm, the abrasive is likely to enter into e.g. a groove for cutting of the LTCC substrate and constitute a foreign matter which is likely to impair the mounting of an element. On the other hand, if the particle size of the abrasive exceeds 150 µm, it becomes difficult to efficiently blast the thick conductor layer in the vicinity of the wall surface of a cavity being a mounting portion of an element. The 50% particle size ($D_{50}$) of the abrasive is preferably within a range of from 80 to 100 µm. More preferred $D_{50}$ is 90 µm.

The mixing ratio of the abrasive (blast material) and the liquid medium (such as water) is such that the abrasive will be from 20 to 60 vol % based on the entire amount of the blast liquid. If the mixing ratio of the abrasive is less than 20 vol %, the wet blasting efficiency is likely to be remarkably low and it becomes difficult to sufficiently planarize the surface of the thick conductor layer. On the other hand, if the ratio of the abrasive exceeds 60 vol %, the viscosity of the blast liquid tends to be too high, whereby the blasting efficiency rather tends to deteriorate. The most preferred mixing ratio is such that the abrasive is 40 vol % and the water is 60 vol %.

Further, the flow rate (blast force) for jetting the blast liquid mixed in such a ratio, is preferably from 1.2 to 1.8 kg/cm$^2$. If the blast force of the blast liquid is less than 1.2 kg/cm$^2$, the effect may be observed for the removal of glass exposed on the surface of the thick conductor layer, but it becomes difficult to carry out sufficient planarization so that the surface roughness Ra of the thick conductor layer becomes at most 0.02 µm. Accordingly, it becomes difficult to impart good sulfurization resistance. If the blast force of the blast liquid exceeds 1.8 kg/cm$^2$, an alumina powder being a blast material is likely to deposit on the surface of the thick conductor layer, whereby the effect for planarizing the surface tends to be small.

In the wet blasting step, it is possible to adopt a method of jetting the blast liquid from a jet orifice disposed at about 5 cm above the transporting surface, towards the thick conductor layer of the LTCC substrate which is continuously transported by a belt conveyor. The transporting rate of the conveyor is preferably adjusted to be from 1 to 1.5 m/min. If the transporting rate is less than 1 m/min, an alumina powder being the blast material is likely to deposit on the thick conductor layer, whereby the effect to planarize the surface tends to be small. If the transporting rate exceeds 1.5 m/min, the blasting effect tends to be small, and it becomes difficult to carry out sufficient planarization for preventing sulfurization.

Plating Step

On the thick conductor layer planarized to a surface roughness Ra of at most 0.02 µm by the wet blast treatment, Ni plating is carried out and then Au plating is carried out to form a Ni/Au-plated layer. The Ni-plated layer is formed in a thickness of from 5 to 10 µm, for example, by electrolytic plating using a nickel sulfamic acid bath. The gold-plated layer can be formed in a thickness of from 0.2 to 0.5 µm, for example, by electrolytic plating using a gold potassium cyanide bath.

In the previous step, the thick conductor layer as the underlayer was subjected to wet blast treatment to fill spaces among the conductor (e.g. Ag) particles thereby to smooth the irregularities and the surface is planarized to a surface roughness Ra of at most 0.02 µm, and accordingly, the thick conductor layer can be completely covered by the Ni/Au-plated layer having the above thickness. Thus, the Ni-plated layer is not exposed, and the sulfurization resistance is excellent, and in the sulfurization test in accordance with JIS C-60068-2-43, it is possible to obtain a Au-plated film free from a black-colored defect due to precipitation of nickel sulfide on the surface of the Au-plated film.

Now, the process for producing the substrate 1 for mounting element having a ceramics substrate, will be described.

Production of Substrate for Mounting Element Having Ceramics Substrate

Formation of Ceramics Green Sheet

Firstly, a ceramics green sheet is formed. This green sheet can be formed by adding a binder and, as the case requires, a plasticizer, a solvent, etc. to a ceramics composition comprising a ceramic powder and a sintering aid to prepare a slurry, forming the slurry into a sheet by e.g. a doctor blade method, followed by drying.

As the ceramics powder, an alumina powder or an aluminum nitride powder may be used. The 50% particle size ($D_{50}$) of the ceramics powder is preferably from 0.5 µm to 2 µm. If $D_{50}$ of the ceramics powder is less than 0.5 µm, the ceramics powder is likely to cohere, and not only the handling tends to be difficult, but also it becomes difficult to uniformly disperse it. On the other hand, if $D_{50}$ exceeds 2 µm, sintering deficiency is likely to occur.

As the sintering aid, one which has been commonly used for the production of a ceramics substrate, may be used. For example, a mixture of $SiO_2$ and an alkaline earth metal oxide, or a rare earth element oxide (particularly a $Y_2O_3$-type aid composed mainly of $Y_2O_3$) may be suitably used. $D_{50}$ of the sintering aid is preferably from 0.5 µm to 4 µm.

Such a ceramics powder and a sintering aid are blended and mixed, for example, so that the ceramics powder would be from 80 mass % to 99 mass %, and the sintering aid would be from 1 mass % to 20 mass %, to obtain a ceramics composition, and to such a ceramics composition, a binder and, as the case requires, a plasticizer, a solvent, etc. are added to obtain a slurry.

As the binder, it is possible to suitably use, for example, a polyvinyl butyral or an acrylic resin. As the plasticizer, it is possible to use, for example, dibutyl phthalate, dioctyl phthalate or butylbenzyl phthalate. Further, as the solvent, it is possible to use an aromatic or alcohol-type organic solvent such as toluene, xylene or butanol. Further, a dispersing agent or a leveling agent may also be used.

The ceramics green sheet thus formed is cut into a prescribed size by a punch cutting die or a punching machine, and at the same time, via holes for interlayer connection may be formed by punching at prescribed positions.

Firing of Ceramics Green Sheet

The non-fired ceramics green sheet is heated at a temperature of from 500° C. to 600° C., to carry out binder burn out by decomposing and removing a binder such as a resin contained in the green sheet. In the case of laminating non-fired ceramics green sheets, a plurality of them are overlaid one on another while adjusting their positions and integrated by heating and pressing, and then, the above-mentioned binder burn out is carried out. Thereafter, heating is further carried out at a temperature of from 1,100 to 2,200° C. to fire the ceramics composition constituting the ceramics green sheet to obtain a ceramics substrate.

Printing of Metal Paste

On the surface of the ceramics substrate, a conductor metal paste is printed by a method such as screen printing to form a non-fired conductor pattern. Further, a conductor metal paste is filled in the above-mentioned via holes for interlayer connection to form non-fired interlayer connection portions. As the conductor paste, one prepared by adding a vehicle such as ethylcellulose and, as the case requires, a solvent, etc. to a metal powder composed mainly of e.g. silver (Ag) or copper (Cu) to form a paste, is used. As the metal powder, a silver (Ag) powder, a mixed powder of silver and palladium, or a mixed powder of silver and platinum, may, for example, be preferably used. Further, in order to sufficiently secure the adhesive strength between the conductor metal and the ceramics substrate, a metal paste having a small amount of glass flit incorporated, may be used.

Firing (Re-Firing) of Metal Paste

The ceramics substrate having the metal paste printed thereon is heated at a temperature of from 500 to 1,000° C. to fire the metal paste formed inside (in via holes) and on the surfaces (the front and rear surfaces) of the ceramics substrate thereby to form a thick conductor layer made of a metal composed mainly of silver (Ag) or copper (Cu).

Wet Blast Treatment

The thick conductor layer formed on the surface of the ceramics substrate is subjected to wet blast treatment. That is, a blast liquid prepared by mixing an abrasive (blast material) with a liquid medium (such as water) is blasted (blown) to the thick conductor layer under high pressure. By this wet blast treatment, spaces among the conductor particles are filled to planarize (smooth) the surface of the thick conductor layer. By adjusting the particle size of the abrasive, the blast force (pressure) of the blast liquid, the treating time, etc., the surface roughness Ra of the thick conductor layer after the treatment can be adjusted to be at most 0.02 µm.

Details of the type and particle size ($D_{50}$) of the abrasive in the wet blast treatment, the mixing ratio of the abrasive to the liquid medium (such as water), the flow rate (blast force) for jetting the blast liquid, the transporting rate of the substrate, etc. are the same as described in the production of the substrate for mounting element having the LTCC substrate, and their description is omitted here.

Plating Step

On the thick conductor layer planarized to a surface roughness Ra of at most 0.02 µm by the wet blast treatment, Ni plating is carried out and then Au plating is carried out to form a Ni/Au-plated layer. The Ni-plated layer is formed in a thickness of from 5 to 10 µm, for example, by electrolytic plating using a nickel sulfamic acid bath. The gold-plated layer can be formed in a thickness of from 0.2 to 0.5 µm, for example, by electrolytic plating using a gold potassium cyanide bath.

In the previous step, the thick conductor layer as the underlayer was subjected to wet blast treatment to fill spaces among the conductor (e.g. Ag) particles thereby to smooth the irregularities and the surface is planarized to a surface roughness Ra of at most 0.02 µm, and accordingly, the thick conductor layer can be completely covered by the Ni/Au-plated layer having the above thickness. Thus, the Ni-plated layer is not exposed, and the sulfurization resistance is excellent, and in the sulfurization test in accordance with JIS C-60068-2-43, it is possible to obtain a Au-plated film free from a black-colored defect due to precipitation of nickel sulfide on the surface of the Au-plated film.

EXAMPLES

Now, the present invention will be described in detail with reference to Examples. However, it should be understood that the present invention is by no means restricted to such Examples.

Example 1

A substrate 10 for mounting element having a construction as shown in FIG. 1, provided with a LTCC substrate, was prepared.

Firstly, a glass ceramics green sheet for main body to prepare the substrate 10 for mounting element, was prepared. In the preparation, raw materials were blended and mixed so that $SiO_2$ became 60.4 mol %, $B_2O_3$ 15.6 mol %, $Al_2O_3$ 6 mol %, CaO 15 mol %, $K_2O$ 1 mol % and $Na_2O$ 2 mol %, and this raw material mixture was put into a platinum crucible and melted at 1,600° C. for 60 minutes. Then, this molten state glass was cast and cooled. This glass was ground by a ball mill made of alumina for 40 hours to obtain a glass powder for substrate main body. Here, ethyl alcohol was used as the solvent at the time of grinding.

40 mass % of this glass powder for main body and 60 mass % of an alumina powder (tradename: AL-45H manufactured by Showa Denko K.K.) were blended and mixed to prepare a glass ceramics composition. To 50 g of this glass ceramics composition, 15 g of an organic solvent (a mixture of toluene, xylene, 2-propanol and 2-butanol in a mass ratio 4:2:2:1), 2.5 g of a plasticizer (di-2-ethylhexyl phthalate), 5 g of polyvinyl butyral (tradename: PVK#3000K manufactured by DENKI KAGAKU KOGYO KABUSHIKI KAISHA) as a binder and a dispersing agent (tradename: BYK180 manufactured by BYK Japan KK) were blended and mixed to prepare a slurry.

This slurry was applied on a PET film by a doctor blade method and dried to prepare a green ceramics sheet for main body which would have a thickness of 0.15 mm after firing.

On the other hand, a conductive powder (tradename: S400-2 manufactured by Daiken Chemical Co., Ltd.) and ethylcellulose as a vehicle were blended in a mass ratio of 90:10 and dispersed in α-terpineol as a solvent so that the solid content would be 87 mass %. Then, kneading was carried out in a porcelain mortar for 1 hour, and further, dispersion was carried out three times by a three roll mill to prepare a metal paste.

Through-holes having a diameter of 0.3 mm were formed in the green ceramics green sheet for main body at portions corresponding to via conductors by means of a punching machine and filled with the above metal paste by a screen printing method to form non-fired via conductor paste layers, and at the same time, a non-fired thick conductor layer was formed, to obtain a glass ceramics green sheet for main body provided with a thick conductor layer.

The glass ceramics green sheet for main body provided with a thick conductor layer, obtained as described above, was held at 550° C. for 5 hours to carry out binder burn out and further held at 870° C. for 30 minutes to carry out firing to prepare a substrate 10 for mounting element for test.

In the obtained substrate 10 for mounting element, the thick conductor layer corresponding to symbol 2 was subjected to wet blasting under the following conditions.

The mixing ratio of the abrasive (blast material) and the liquid medium (water) was such that the abrasive was 40 vol % based on the entire blast liquid. Further, by adjusting the flow rate (blast force) for jetting the blast liquid mixed in such a ratio to be 1.5 kg/cm², the blast liquid was jetted from a jet orifice disposed at 5 cm above the transporting surface, towards the thick conductor layer which was transported continuously by a belt conveyor. The surface roughness Ra of the thick conductor layer was thereby made to be 0.01 μm. Here, the transporting rate of the belt conveyor was adjusted to 1.2 m/min.

On the surface of the obtained thick conductor layer, a Ni-plated film having a thickness of 7 μm was formed by electrolytic plating using a nickel sulfate bath, and on its surface, a Au-plated film having a thickness of 0.3 μm was formed by electrolytic plating using a gold potassium cyanide bath. The substrate 10 for mounting element thus obtained was subjected to exposure for 100 hours by a sulfurization test in accordance with JIS C-60068-2-43, whereby a black-colored defect due to precipitation of nickel-sulfide did not form on the surface of the Au-plated film.

Example 2

A substrate 10 for mounting element having a construction as shown in FIG. 1, provided with a ceramics substrate, is prepared.

Firstly, a ceramics green sheet for main body to prepare the substrate 10 for mounting element, is prepared. In the preparation, firstly, 96 mass % of an alumina powder (tradename: AL-45H manufactured by Showa Denko K.K.) and 4 mass % of a sintering aid (a talc powder containing 65.8 mass % of $SiO_2$ and 34.2 mass % of MgO) were blended and mixed to prepare a ceramics composition. To 50 g of this ceramics composition, 15 g of an organic solvent (a mixture of toluene, xylene, 2-propanol and 2-butanol in a mass ratio of 4:2:2:1), 2.5 g of a plasticizer (di-2-ethylhexyl phthalate), 5 g of polyvinyl butyral (tradename: PVK#3000K manufactured by DENKI KAGAKU KOGYO KABUSHIKI KAISHA) as a binder and a dispersing agent (tradename: BYK180 manufactured by BYK Japan KK)) are blended and mixed to prepare a slurry.

This slurry is applied on a PET film by a doctor blade method, followed by drying to prepare a ceramics green sheet for main body which will have a thickness of 1 mm after firing. Then, through-holes having a diameter of 0.3 mm are formed at portions corresponding to via conductors by means of a punching machine.

Then, this ceramics green sheet for main body is held at 550° C. for 5 hours to carry out binder burn out and further held at 1,500° C. for 60 minutes to carry out firing to prepare a substrate made of alumina (alumina substrate).

On the other hand, an electroconductive powder (tradename: S400-2 manufactured by Daiken Chemical Co., Ltd.) and ethylcellulose as a vehicle are blended in a mass ratio of 90:10, and dispersed in α-terpineol as a solvent so that the solid content will be 87 mass %. Then, kneading is carried out in a porcelain mortar for 1 hour, and further, dispersion is carried out three times by a three roll mill to prepare a metal paste.

On the surface and in the through holes of the alumina substrate, the metal paste is filled by a screen printing method to form non-fired via conductor paste layers, and at the same time, a non-fired thick conductor layer is formed to obtain a ceramics substrate provided with a thick conductor layer.

Then, this ceramics substrate provided with a thick conductor layer is held at 870° C. for 30 minutes to fire the metal paste thereby to prepare a substrate 10 for mounting element for test.

In this substrate 10 for mounting element, the thick conductor layer corresponding to symbol 2 is subjected to wet blast treatment under the following conditions.

The mixing ratio of the abrasive (blast material) and the liquid medium (water) is adjusted so that the abrasive is 40 vol % based on the entire blast liquid. Further, by applying a pressure of 1.5 kg/cm² to the blast liquid mixed in such a ratio by means of a nozzle having an orifice diameter of 8 mm and made of boron carbide, the blast liquid is jetted from a jet orifice disposed at 5 cm above the transporting surface, towards the thick conductor layer which is continuously transported by a belt conveyor. The surface roughness Ra of the thick conductor layer is thereby made to be 0.01 μm. Further, the transporting rate of the belt conveyor is adjusted to 1.2 m/min.

On the surface of this thick conductor layer, a Ni-plated film of 7 μm is formed by electrolytic plating in a nickel sulfamic acid bath, and on its surface, a Au-plated film having a thickness of 0.3 μm is formed by electrolytic plating in a gold potassium cyanide bath. The substrate 10 for mounting element thus obtained is subjected to exposure for 100 hours in a sulfurization test in accordance with JIS C-60068-2-43, whereby a black-colored defect due to precipitation of nickel sulfide will not form on the surface of the Au-plated film.

In the foregoing, the embodiments of the present invention have been described, but it is apparent that the present invention is by no means limited thereto, and various changes may be carried out within a range disclosed in Claims.

MEANING OF SYMBOLS

1: inorganic insulating substrate, 2: thick conductor layer, 3: Ni/Au-plated layer, 4: via conductor, 10: substrate for mounting element

What is claimed is:

1. A process for producing a substrate for mounting element, comprising:
   forming a substrate having a thick conductor layer made of a metal composed mainly of Ag or Cu, on a surface of an inorganic insulating substrate made of an inorganic insulating material;
   applying wet blast treatment to the thick conductor layer to planarize the surface of the thick conductor layer to a surface roughness Ra of at most 0.02 μm; and
   forming a Ni/Au-plated layer on the thick conductor layer having the surface planarized by the wet blast treatment,
   wherein the forming of the substrate comprises printing a metal paste composed mainly of Ag or Cu on a surface of the substrate made of a glass ceramics composition comprising a glass powder and a ceramics powder, to form a conductor pattern, and firing the substrate having the conductor pattern formed to sinter the glass ceramics composition and fire the metal paste thereby to form the thick conductor layer made of the metal.

2. The process for producing a substrate for mounting element according to claim 1, wherein the applying of the wet blast treatment comprises blasting to the thick conductor layer a blast liquid comprising water and a ceramics powder having a particle size in a range of from 25 to 150 μm.

3. The process for producing a substrate for mounting element according to claim 2, wherein the blast liquid has a mixing ratio of the ceramics powder in a range of from 20 to 60 vol % based on the total amount of the ceramics powder and the water.

4. The process for producing a substrate for mounting element according to claim 2, wherein the applying of the wet blast treatment comprises blasting the blast liquid with a blast force in a range of from 1.2 to 1.8 kg/cm$^2$.

5. The process for producing a substrate for mounting element according to claim 3, wherein the applying of the wet blast treatment comprises blasting the blast liquid with a blast force in a range of from 1.2 to 1.8 kg/cm$^2$.

6. The process for producing a substrate for mounting element according to claim 1, wherein the applying of the wet blast treatment comprises blasting a blast liquid comprising an abrasive and a liquid medium with a blast force in a range of from 1.2 to 1.8 kg/cm$^2$.

7. The process for producing a substrate for mounting element according to claim 1, wherein the applying of the wet blast treatment comprises blasting to the thick conductor layer a blast liquid comprising a liquid medium and an abrasive.

8. The process for producing a substrate for mounting element according to claim 7, wherein the blast liquid has a mixing ratio of the abrasive in a range of from 20 to 60 vol % based on the total amount of the abrasive and the liquid medium.

9. The process for producing a substrate for mounting element according to claim 1, wherein the applying of the wet blast treatment comprises blasting to the thick conductor layer a blast liquid comprising a liquid medium and a ceramics powder having a particle size in a range of from 25 to 150 μm.

10. The process for producing a substrate for mounting element according to claim 9, wherein the blast liquid has a mixing ratio of the ceramics powder in a range of from 20 to 60 vol % based on the total amount of the ceramics powder and the liquid medium.

11. A process for producing a substrate for mounting element, comprising:
    forming a ceramic substrate having a thick conductor layer made of a metal composed mainly of Ag or Cu, on a surface of an inorganic insulating substrate made of an inorganic insulating material;
    applying wet blast treatment to the thick conductor layer to planarize a surface of the thick conductor layer to a surface roughness Ra of at most 0.02 μm; and
    forming a Ni/Au-plated layer on the thick conductor layer having the surface planarized by the wet blast treatment,
    wherein the forming of the ceramic substrate comprises firing a ceramics composition comprising a ceramics powder and a sintering aid to obtain the ceramics substrate, printing a metal paste composed mainly of Ag or Cu on a surface of the ceramics substrate to form a conductor pattern, and re-firing the ceramics substrate having the conductor pattern formed to form, from the metal paste, the thick conductor layer made of the metal.

12. The process for producing a substrate for mounting element according to claim 11, wherein the applying of the wet blast treatment comprises blasting to the thick conductor layer a blast liquid comprising water and a ceramics powder having a particle size in a range of from 25 to 150 μm.

13. The process for producing a substrate for mounting element according to claim 12, wherein the blast liquid has a mixing ratio of the ceramics powder in a range of from 20 to 60 vol % based on the total amount of the ceramics powder and the water.

14. The process for producing a substrate for mounting element according to claim 13, wherein the applying of the wet blast treatment comprises blasting the blast liquid with a blast force in a range of from 1.2 to 1.8 kg/cm$^2$.

15. The process for producing a substrate for mounting element according to claim 12, wherein the applying of the wet blast treatment comprises blasting the blast liquid with a blast force in a range of from 1.2 to 1.8 kg/cm$^2$.

16. The process for producing a substrate for mounting element according to claim 11, wherein the applying of the wet blast treatment comprises blasting a blast liquid comprising an abrasive and a liquid medium with a blast force in a range of from 1.2 to 1.8 kg/cm$^2$.

17. The process for producing a substrate for mounting element according to claim 11, wherein the applying of the wet blast treatment comprises blasting to the thick conductor layer a blast liquid comprising a liquid medium and an abrasive.

18. The process for producing a substrate for mounting element according to claim 17, wherein the blast liquid has a mixing ratio of the abrasive in a range of from 20 to 60 vol % based on the total amount of the abrasive and the liquid medium.

19. The process for producing a substrate for mounting element according to claim 11, wherein the applying of the wet blast treatment comprises blasting to the thick conductor layer a blast liquid comprising a liquid medium and a ceramics powder having a particle size in a range of from 25 to 150 μm.

20. The process for producing a substrate for mounting element according to claim 19, wherein the blast liquid has a mixing ratio of the ceramics powder in a range of from 20 to 60 vol % based on the total amount of the ceramics powder and the liquid medium.

* * * * *